United States Patent
Wang

(10) Patent No.: US 8,736,104 B2
(45) Date of Patent: May 27, 2014

(54) POWER SUPPLY

(75) Inventor: Guan Wang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 464 days.

(21) Appl. No.: 13/171,673

(22) Filed: Jun. 29, 2011

(65) Prior Publication Data

US 2012/0293014 A1 Nov. 22, 2012

(30) Foreign Application Priority Data

May 19, 2011 (CN) .......................... 2011 1 0130324

(51) Int. Cl.
*H02J 1/10* (2006.01)
(52) U.S. Cl.
USPC .......................................................... 307/29
(58) Field of Classification Search
USPC .......................................................... 307/29
See application file for complete search history.

(56) References Cited

U.S. PATENT DOCUMENTS

2011/0109322 A1* 5/2011 Shi et al. ...................... 324/555

* cited by examiner

*Primary Examiner* — Robert L. Deberadinis
(74) *Attorney, Agent, or Firm* — Novak Druce Connolly Bove + Quigg LLP

(57) ABSTRACT

A power supply includes an alternating current (AC)/direct current (DC) converter, a control unit, and a selection switch. The AC/DC converter is connected to an AC power source to convert an AC voltage into a DC voltage. The control unit includes a controller and a switch. The selection switch is connected to the controller, and connected between the AC converter and the power module of a motherboard to connect the AC converter to either the power module or the controller. When the AC/DC converter is connected to the controller, the controller receives the DC voltage to be started, the controller turns on the switch for a predetermined connection time to make the DC voltage be input to the power module, and then turns off the switch for a predetermined disconnection time to make the DC voltage fail to be input to the power module.

7 Claims, 2 Drawing Sheets

POWER SUPPLY

BACKGROUND

1. Technical Field

The present disclosure relates to a power supply.

2. Description of Related Art

During testing of motherboards, an alternating current (AC) power cycle test is required. The AC power cycle test requires that the motherboard is repeatedly powered on or off under a normal working state. If the motherboard can be powered on and off without problems, it means that the motherboard has a high stability. However, in testing, a remote host computer needs to be set to power on and power off the motherboard, which is convenient.

BRIEF DESCRIPTION OF THE DRAWINGS

Many aspects of the present embodiments can be better understood with reference to the following drawings. The components in the drawing are not necessarily drawn to scale, the emphasis instead being placed upon clearly illustrating the principles of the present embodiments. Moreover, in the drawing, all the views are schematic, and like reference numerals designate corresponding parts throughout the several views.

DETAILED DESCRIPTION

The disclosure, including the accompanying drawings in which like references indicate similar elements, is illustrated by way of example and not by way of limitation. It should be noted that references to "an" or "one" embodiment in this disclosure are not necessarily to the same embodiment, and such references mean at least one.

Figure 1:
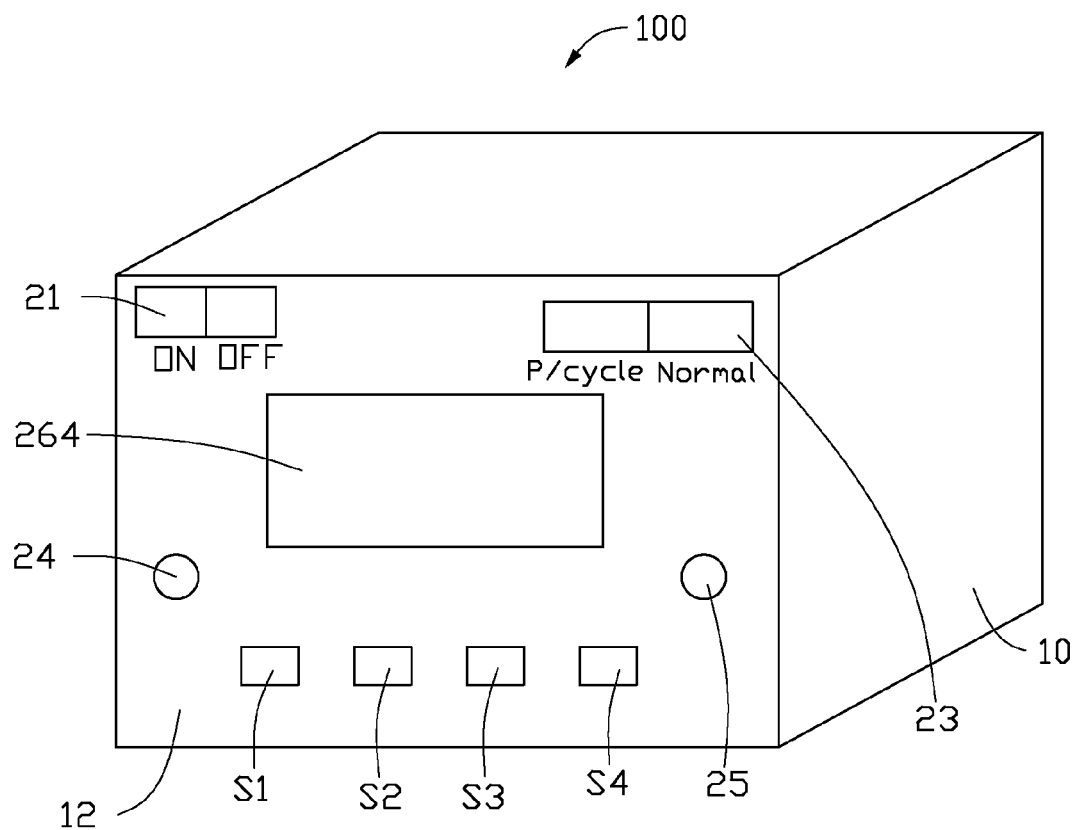
FIG. 1 is a schematic view of an embodiment of a power supply.
Figure 2:
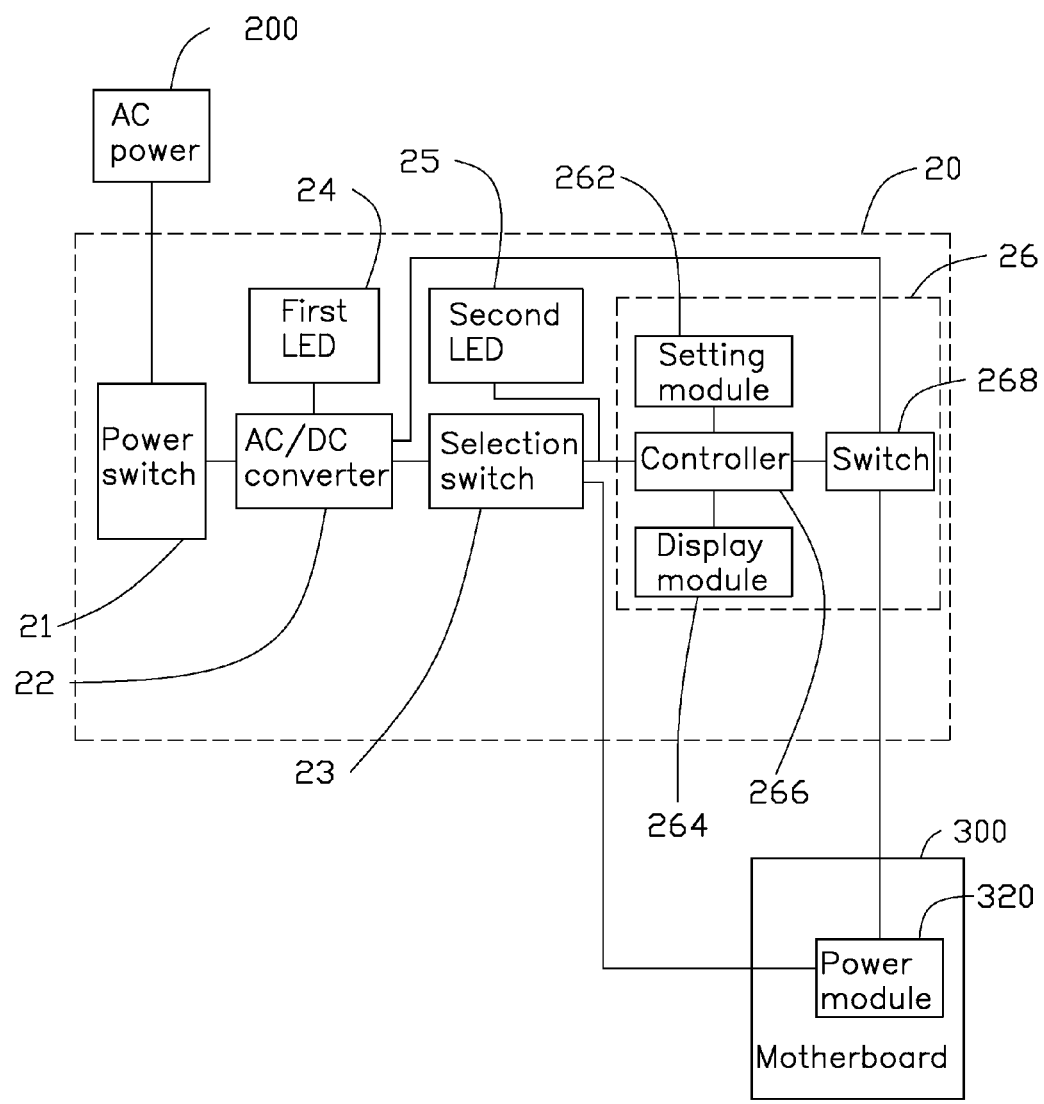
FIG. 2 is a block diagram of the power supply of FIG. 1 connecting an alternating current power source to a motherboard.

Referring to FIGS. 1 and 2, an embodiment of a power supply 100 is used to connect an alternating current (AC) power source 200 to a power module 320 of a motherboard 300, to power the motherboard 300. The power supply 100 includes an enclosure 10 and a power control system 20. The power control system 20 includes a power switch 21, an alternating current to direct current (AC/DC) converter 22, a selection switch 23, a first light emitting diode (LED) 24, a second LED 25, and a control unit 26. The power switch 21, the selection switch 23, and the first and second LEDs 24 and 25 are mounted on a front wall 12 of the enclosure 10. The AC/DC converter 22 is mounted in the enclosure 10.

The power switch 21 is connected between the AC power source 200 and the AC/DC converter 22. When the power switch 21 is set at a power on state by pressing a first position ON of the power switch 21 on the front wall 12 of the enclosure 10, the power switch 21 connects the AC power source 200 to the AC/DC converter 22. The AC power source 200 outputs an AC voltage to the AC/DC converter 22. When the power switch 21 is at a second position OFF of the front wall 12 of the enclosure 10, the AC power source 200 is disconnected from the AC/DC converter 22. The AC/DC converter 22 fails to receive the AC voltage from the AC power source 200. In other embodiments, the power switch 21 may be a switch of the rocking type (a rocker switch).

The AC/DC converter 22 is used to convert the AC voltage from the AC power source 200 into a DC voltage.

The first LED 24 is connected to an output of the AC/DC converter 22. When the power switch 21 is at the power on state, the first LED 24 receives a DC voltage from the AC/DC converter 22 and lights up to denote that the AC power source 200 is connected to the AC/DC converter 22. The power supply 100 is powered on. When the power switch 21 is set at the a power off state by pressing a second button OFF of the power switch 21 on the front wall 12 of the enclosure 10, the first LED fails to receive the DC voltage from the AC/DC converter 22 and fails to light up to denote that the AC power source 200 is disconnected from the AC/DC converter 22.

The selection switch 23 is connected to the AC/DC converter 22, the power module 320, and the control unit 26, to either connect the AC/DC converter 22 either to the power module 320 or to the control unit 26. The selection switch 23 is further connected to the second LED 25. When the selection switch 23 is set at a first state by pressing a first button Normal of the selection switch 23 on the front wall 12 of the enclosure 10, the selection switch 23 allows the AC/DC converter 22 to connect to the power module 320. The second LED 25 does not receive the DC voltage from the AC/DC converter 22 and does not light up, indicating an unregulated and continuous supply of DC voltage to the motherboard 300. When the selection switch 23 is set at a second state by pressing a second button P/cycle of the selection switch 23 on the front wall 12 of the enclosure 10, the selection switch 23 connects the AC/DC converter 22 to the control unit 26. The second LED 25 receives the DC voltage from the AC/DC converter 22 and lights up to denote that the power supply 100 can entirely control the supply of power to the motherboard 300.

The control unit 26 includes a setting module 262, a display module 264, a controller 266, and a switch 268. The setting module 262 includes first to fourth buttons S1-S4. The controller 266 is connected to the display module 264, the switch 268, and the first to fourth buttons S1-S4. The switch 268 is connected to the AC/DC converter 22 and the controller 266. The first to fourth buttons S1-S4 and the display module 264 are mounted on the front wall 12 of the enclosure 10. The controller 266 and the switch 268 are mounted in the enclosure 10.

The controller 266 stores a predetermined connection time, a predetermined disconnection time, and predetermined number of cycles. One cycle for example is that the motherboard 300 is powered on for a connection time and then powered off for a disconnection time after powering on for the connection time. In the embodiment, the predetermined connection time and the predetermined disconnection time are both two minutes. The predetermined number of cycles is twice. In other embodiments, the predetermined connection time, the predetermined disconnection time, and the predetermined number of cycles can be changed according to need.

When the selection switch 23 is at the second state by pressing the P/cycle button, the controller 266 receives the DC voltage from the AC/DC converter 22. The controller 266 is powered on.

The first button S1 is used to control the display module 264 to display a menu. The menu includes first to third items. The first item is a connection time. The second item is a disconnection time. The third item is a number of cycles. A selection cursor of the display module 264 flashes to highlight one of the first to third items, such as the connection time.

The second button S2 is used to move the selection cursor along a first direction. When the second button S2 is pressed once, the selection cursor moves from the first item to the second item.

The third button S3 is used to move the selection cursor along a second direction opposite to the first direction. When the third button S3 is pressed once, the selection cursor moves from the second item to the first item.

The fourth button S4 is used to confirm one of the first to third items in order that the confirmed item may be adjusted or reset. The second button S2 is further used to increase the connection time, the disconnection time, or the number of cycles of the confirmed item. The third button S3 is used to decrease the connection time, the disconnection time, or the number of cycles of the confirmed item. In the embodiment, when the confirmed item needs to be adjusted and the second button S2 is pressed once, the connection time or the disconnection time of the confirmed item increases one minute or the number of cycle increases one. The third button S3 is pressed once, the connection time or disconnection time of the confirmed item decreases one minute or the number of cycle decreases one.

The fourth button S4 is further used to make the controller 266 store the connection time, the disconnection time, or the number of cycles of the adjusted items. The controller 266 controls the cursor to advance to the next item and flash to highlight the next item after the adjustment of one item has been completed.

When the fourth button S4 is pressed twice continuously, the controller 266 is started to turn on the switch 268 for the stored connection time to supply the DC voltage from the AC/DC converter 22 to the power module 320, and to turn off the switch 268 for the stored disconnection time after the switch 268 is turned on for the stored connection time, to stop supplying the DC voltage to the power module 320. When the number of the motherboard 300 being powered on for the predetermined connection time and then being powered off for the predetermined disconnection time is equal to the predetermined number of cycle, the controller stops working.

An example is given to describe how the power supply 100 may be controlled to power on the motherboard 300, and then power off the motherboard 300. The motherboard 300 needs to be powered on for three minutes, and powered off for one minute. Two cycles are to be applied. The power supply 100 is connected between the AC power source 200 and the power module 320 of the motherboard 300. The power switch 21 is switched to the power on state. The selection switch 23 is switched to the second state. The first and second LEDs 24 and 25 light up. The first button S1 is pressed. The display module 264 displays the predetermined connection time, the predetermined disconnection time, and the number of cycles, that is, two minutes, one minute, and twice. The selection cursor flashes to highlight the displayed predetermined connection time. The fourth button S4 is pressed once to confirm the predetermined connection time to be adjusted. The second button S2 is pressed once to make the display of the connection time increase to three minutes. The fourth button S4 is pressed once. The controller 266 stores the adjusted connection time. The selection cursor moves down and flashes to highlight the second item, the disconnection time. The fourth button S4 is pressed once to confirm the second item to adjust the disconnection time. The third button S3 is pressed once to make the disconnection time displayed decrease to one minute. The fourth button S4 is pressed once. The controller 266 stores the adjusted disconnection time. The selection cursor moves down and blinks on the third item, the number of cycles, which displays two as the number of cycles required. The displayed cycle times need not to be adjusted. The fourth button S4 is pressed twice continuously to start the controller 266. According to the adjusted connection time, the adjusted disconnection time, and the adjusted number of cycle. The controller 266 turns on the power switch 268 for three minutes, and turns off the power switch 21 for one minute after turning on the power switch 268 for three minutes. And then, the controller 266 turns on the power switch 268 for three minutes after turning off the power switch 268 for one minute, and turns off the power switch 268 for one minute after turning on the power switch 268 for three minute. The controller 266 controls the display module 264 to display that the process is at an end.

In other embodiments, the first and second LEDs 24 and 25 can be omitted. The power switch 21 can be omitted. When the power supply 100 is connected to the AC power source 200, the AC power source 200 outputs the AC voltage to the AC/DC converter 22. If the power supply 100 is only controlled to power on the motherboard 300 for the predetermined connection time, and then power off the motherboard 300 for the predetermined disconnection time, and the predetermined connection time and the predetermined disconnection time need not to be changed, the setting module 562 and the display module 264 can be omitted.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A power supply to be connected between an alternating current (AC) power source and a power module of a motherboard to power the motherboard, the power supply comprising:
   an alternating current to direct current (AC/DC) converter connected to the AC power source to receive an AC voltage from the AC power source and to convert the AC voltage into a DC voltage;
   a control unit comprising:
      a controller; and
         a switch connected between the controller and the power module, and connected to the AC/DC converter; and
   a selection switch connected to the controller, and connected between the AC/DC converter and the power module of the motherboard to connect the AC/DC converter either to the power module or to connect the AC/DC convert to the controller;
   wherein when the AC/DC converter is connected to the controller, the controller receives the DC voltage from the AC/DC converter, the controller stores a predetermined connection time and a predetermined disconnection time, when the controller is started, the controller turns on the switch for the predetermined connection time to make the DC voltage be input to the power module, and turns off the switch for the predetermined disconnection time to make the DC voltage fail to be input to the power module after turning on the switch for the predetermined connection time.

2. The power supply of claim 1, wherein the controller further stores a predetermined number of cycle, one cycle is that the motherboard is powered on for the predetermined connection time and then is powered off for the predetermined disconnection time after powering on for the connection time, when the number of the motherboard being powered on for the predetermined connection time and then being powered off for the predetermined disconnection time are equal to the predetermined number of cycle, the controller stops working.

3. The power supply of claim 2, wherein the control unit further comprises a setting module and a display module, the setting module and the display module are connected to the controller, the display module is used to display the stored predetermined connection time, the stored predetermined disconnection time, and the stored predetermined number of cycle, the setting module is used to adjust the predetermined connection time, the predetermined disconnection time, and the predetermined number of cycle, and make the controller store the adjusted connection time, the adjusted disconnection time, and the adjusted number of cycle.

4. The power supply of claim 3, wherein the setting module comprises first to fourth buttons, the first button is used to control the display module to display a menu, the menu comprises first to third items, the first item stands for the predetermined connection time, the second item stands for the predetermined disconnection time, the third item stands for the predetermined number of cycle, a selection cursor of the display module flashes to highlight the first item, the second button is further used to move the selection cursor along a first direction, when the second button is pressed once, the selection cursor is moved from one item to another item along the first direction, the third button is used to move the selection cursor along a second direction opposite to the first direction, when the third button is pressed once, the selection cursor is moved from one item to another item along the second direction, the fourth button is used to confirm the item which the cursor blinks on to be adjusted, when one of the first to third items needs to be adjusted, the second button is further used to increase the time of the first and second items or increase the times of the third item, the third button is further used to decrease the time of the first and second items or decrease the times of the third item, the fourth button is further used to make the controller store the adjusted first to third items, the controller controls the selection cursor to move down to another item after adjusting one item, when the fourth button is pressed twice continuously, the controller is started to turn on the switch for the adjusted connection time and then turn off the switch for the adjusted disconnection time after turning on the switch for the adjusted connection time, and repeat turning on and then turning off the switch until the number of the switch being turned on for the adjusted connection time and then turned off for the adjusted disconnection time is equal to the predetermined number of cycle.

5. The power supply of claim 1, further comprising a light emitting diode (LED) connected to the AC/DC converter, wherein when the AC power source is connected to the AC/DC converter, the LED lights, when the AC power source is disconnected from the AC/DC converter, the LED fails to light.

6. The power supply of claim 1, further comprising a light emitting diode (LED) connected to the selection switch, wherein when the AC/DC converter is connected to the controller, the LED lights, when the AC/DC converter is disconnected from the controller, the LED fails to light.

7. The power supply of claim 1, further comprising a power switch, wherein the power switch controls the AC power source to be connected to the AC/DC converter or disconnected from the AC/DC converter.

* * * * *